United States Patent
Mulfinger et al.

(10) Patent No.: US 10,050,119 B2
(45) Date of Patent: Aug. 14, 2018

(54) METHOD FOR LATE DIFFERENTIAL SOI THINNING FOR IMPROVED FDSOI PERFORMANCE AND HCI OPTIMIZATION

(71) Applicant: GLOBALFOUNDRIES Inc., Grand Cayman (KY)

(72) Inventors: George Robert Mulfinger, Gansevoort, NY (US); Dina H. Triyoso, Mechanicville, NY (US); Ryan Sporer, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/256,027

(22) Filed: Sep. 2, 2016

(65) Prior Publication Data

US 2018/0069091 A1    Mar. 8, 2018

(51) Int. Cl.
| | | |
|---|---|---|
| *H01L 27/12* | (2006.01) | |
| *H01L 29/66* | (2006.01) | |
| *H01L 29/78* | (2006.01) | |
| *H01L 29/772* | (2006.01) | |
| *H01L 27/088* | (2006.01) | |
| *H01L 21/324* | (2006.01) | |
| *H01L 29/06* | (2006.01) | |
| *H01L 29/417* | (2006.01) | |
| *H01L 29/51* | (2006.01) | |
| *H01L 21/84* | (2006.01) | |
| *H01L 29/786* | (2006.01) | |

(52) U.S. Cl.
CPC ........ *H01L 29/66545* (2013.01); *H01L 21/84* (2013.01); *H01L 27/1203* (2013.01); *H01L 29/0649* (2013.01); *H01L 29/0684* (2013.01); *H01L 29/41783* (2013.01); *H01L 29/517* (2013.01); *H01L 29/786* (2013.01)

(58) Field of Classification Search
CPC .............. H01L 29/66545; H01L 21/84; H01L 27/1203; H01L 29/517; H01L 29/0684; H01L 29/0649; H01L 29/41783; H01L 29/786
USPC .................................................. 257/390–394
See application file for complete search history.

(56) References Cited

U.S. PATENT DOCUMENTS

| | | | |
|---|---|---|---|
| 8,629,502 B2 * | 1/2014 | Cheng ............... | H01L 29/66772 257/336 |
| 9,406,529 B1 * | 8/2016 | Chan ..................... | H01L 29/165 |
| 2015/0001622 A1 | 1/2015 | Khalil et al. | |

* cited by examiner

*Primary Examiner* — Marcos D Pizarro
*Assistant Examiner* — Nelson Garces
(74) *Attorney, Agent, or Firm* — Ditthavong & Steiner, P.C.

(57) ABSTRACT

Methods for selectively thinning a silicon channel area under a gate electrode and resulting devices are disclosed. Embodiments include providing a SOI substrate including a Si-layer; providing a first dummy-gate electrode over a first gate-oxide between first spacers over a first channel area of the Si-layer and a second dummy-gate electrode over a second gate-oxide between second spacers over a second channel area of the Si-layer; forming a S/D region adjacent each spacer; forming an oxide over the S/D regions and the spacers; removing the dummy-gate electrodes creating first and second cavities between respective first and second spacers; forming a mask with an opening over the first cavity; removing the first gate-oxide; thinning the Si-layer under the first cavity, forming a recess in the Si-layer; forming a third gate-oxide on recess side and bottom surfaces; and filling the recess and the cavities with metal, forming first and second RMG electrodes.

11 Claims, 5 Drawing Sheets

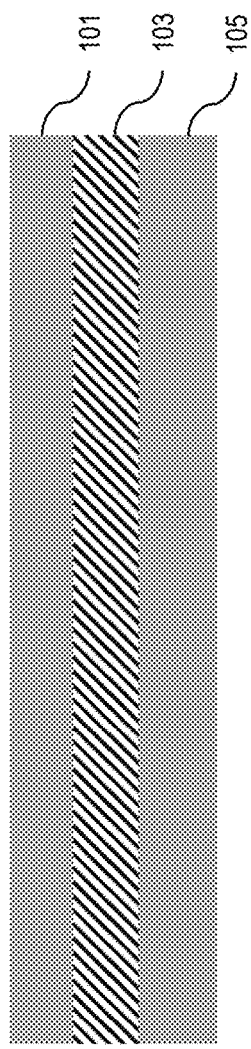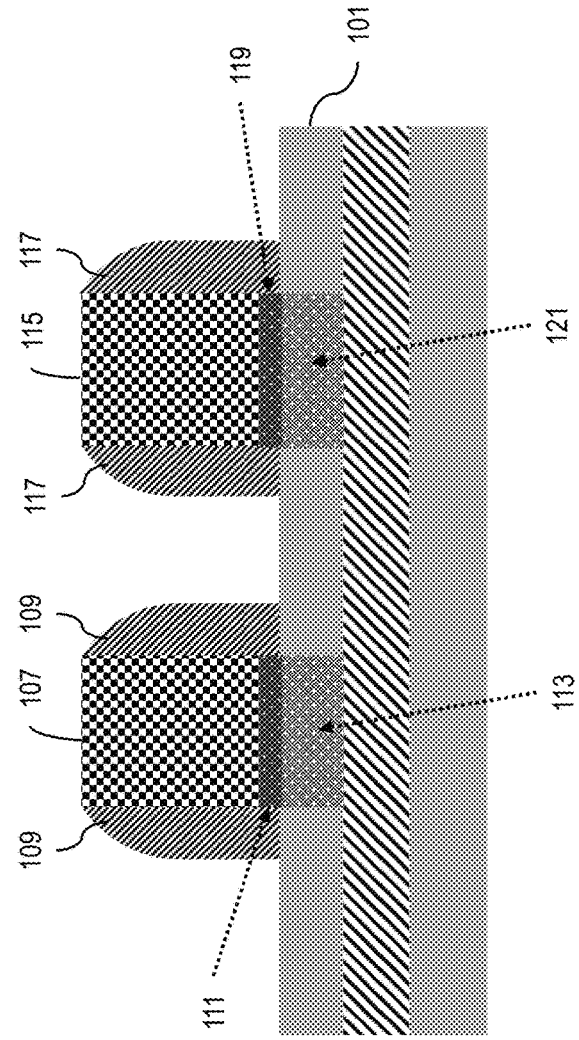

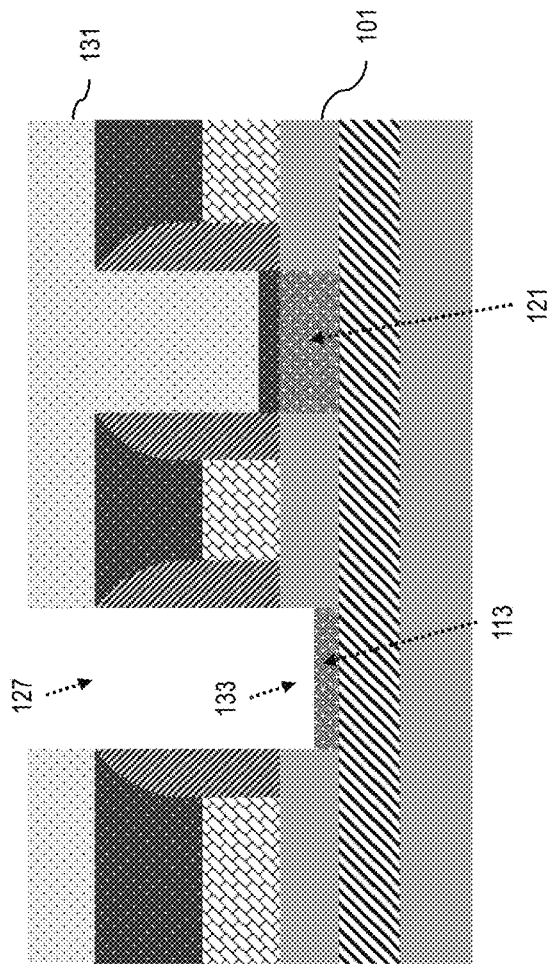
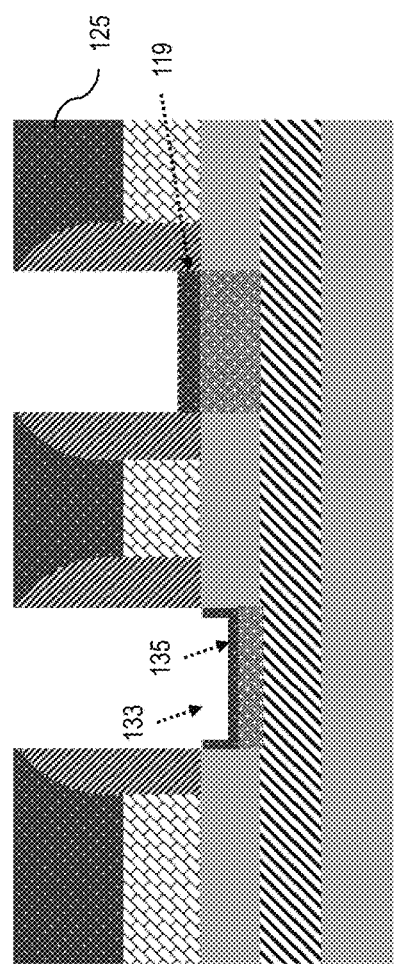
FIG. 1G
FIG. 1H

METHOD FOR LATE DIFFERENTIAL SOI THINNING FOR IMPROVED FDSOI PERFORMANCE AND HCI OPTIMIZATION

TECHNICAL FIELD

The present disclosure relates generally to designing and fabricating integrated circuit (IC) devices. The present disclosure is particularly applicable to creating different channel thicknesses for different device types in integrated circuit (IC) devices in the 28 nanometer (nm) technology node and beyond.

BACKGROUND

Generally, an IC device may include high and low voltage devices (e.g. transistors) that can provide different functionalities and have different applications. For example, a logic core device may operate at a lower voltage than an analog device operating at a higher voltage. Advanced IC design and fabrication processes may be based on silicon-on-insulator (SOI) technology where a channel area of a device may be in the SOI layer. However, SOI channel areas of devices that operate at different voltages may be affected or perform differently. Some solutions may utilize different SOI channel thicknesses for the different devices such that the channel thickness of a device operating at a higher drain voltage may be greater than a channel thickness of a device operating at a lower voltage. However, forming the different channel thicknesses requires the use of an additional mask. Additionally, a uniform thinner SOI layer can cause challenges in forming raised source/drain regions adjacent each device.

A need therefore exists for a methodology for selectively thinning a channel area under a gate of a device and the resulting device.

SUMMARY

An aspect of the present disclosure is a method enabling selectively thinning a channel layer under a gate of a device in an IC device.

Another aspect of the present disclosure is an IC device including different channel thicknesses in a channel layer of different devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing a semiconductor stack including a silicon (Si) layer over an insulator layer over a Si substrate, respectively; providing a first dummy gate electrode over a first gate oxide layer between first spacers over a first channel area of the Si layer and a second dummy gate electrode over a second gate oxide layer between second spacers over a second channel area of the Si layer; forming a source/drain (S/D) region adjacent an exposed side of each first and second spacer; forming an oxide over the S/D regions and the first and second spacers; removing the first and second dummy gate electrodes creating first and second cavities between respective first and second spacers; forming a mask with an opening over the first cavity; removing the first gate oxide layer through the mask and the first cavity; thinning the Si layer under the first cavity, forming a recess in the Si layer; forming a third gate oxide layer on side walls and a bottom surface of the recess; and filling the recess and the first and second cavities with a metal, forming first and second replacement metal gate (RMG) electrodes.

Some aspects include thinning the Si layer by oxidizing a portion of the Si layer through the first cavity; and removing the oxidized layer.

Another aspect includes thinning the Si layer under the first cavity by etching.

One aspect includes forming first and second devices including the first and second RMG electrodes, respectively; and thinning the Si layer under the first cavity based on performance criteria of the first device.

In a further aspect, forming the first and second RMG electrodes includes filling the recess and the first cavity with a first work-function metal; and filling the second cavity with a second work-function metal.

An additional aspect includes thinning the Si layer under the first cavity to a thickness of 3 to 8 nm.

Another aspect includes forming a core (SG) device and an input/output (EG) device including the first and second RMG electrodes, respectively.

In one aspect, the SG device has a lower threshold-voltage than a threshold-voltage of the EG device.

One aspect includes forming the S/D regions by epitaxially growing raised S/D regions.

A further aspect includes forming the third gate oxide layer to a thickness less than a thickness of the first and second gate oxide layers.

Another aspect of the present disclosure includes a device including: a semiconductor stack including a Si layer over an insulator layer over a Si substrate, respectively; a first RMG stack between first spacers over a first channel area of the Si layer; a second RMG stack between second spacers over a second channel area of the Si layer, wherein the first channel area is thinner than the second channel area; and a S/D region adjacent an exposed side of each first and second spacer.

In one aspect, the first RMG stack includes a first work-function metal electrode; and the second RMG stack includes a second work-function metal electrode.

In a further aspect, the Si layer of the first channel area has a thickness of 3 to 8 nm.

An additional aspect includes a SG and an EG device including the first and second RMG electrodes, respectively.

In one aspect, a threshold-voltage of the SG device is lower than a threshold-voltage of the EG device.

In another aspect, the S/D regions include epitaxially grown raised S/D regions.

In a further aspect, the first channel is recessed in the Si layer.

In an additional aspect, the first and second RMG stacks include first and second gate oxide layers, respectively, the first gate oxide layer having a thickness less than a thickness of the second gate oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1I illustrate process steps for selectively thinning a channel layer under a gate stack of a device, in accordance with an exemplary embodiment.

DETAILED DESCRIPTION

Figure 1C:
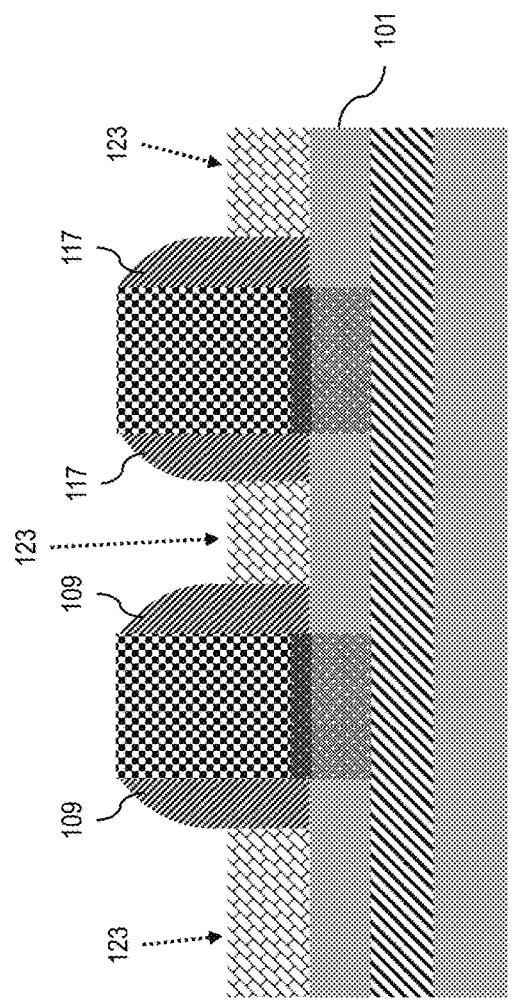

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of a need for additional masking layers attendant upon forming different types of devices with channel areas having different thicknesses or performance issues for core devices or reliability issues for input/output device attendant upon forming the two types of devices with channel areas having the same thickness. The present disclosure addresses and solves such problems, for instance, by, inter alia, selectively thinning a channel layer under a gate structure of a device that would benefit from a thinner channel area while the channel layer in other areas remains at its initial thickness.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIG. 1A illustrates a cross sectional view of a semiconductor stack including a device channel layer 101 over an insulator layer 103 over a bulk Si substrate 105. The device channel layer 101 may be Si, silicon-germanium, or a material from the III-V group of materials. The stack forms a silicon-on-oxide (SOI) substrate.

FIG. 1B illustrates a gate stack of a first device (e.g. a SG device), including a polysilicon dummy gate electrode 107 between spacers 109 over a gate oxide layer 111 over a channel area 113 of the Si layer 101. Similarly illustrated, for a second device (e.g. an EG device), is a gate stack including a polysilicon dummy gate electrode 115 between spacers 117 over a gate oxide layer 119 over a channel area 121 of the Si layer 101.

In FIG. 1C, a S/D region 123 is formed, over the Si layer 101 (e.g. on an initial thickness of the Si layer and prior to any changes to it), adjacent an exposed side of each spacer 109 and 117. The S/D regions 123 may be epitaxially grown raised S/D regions.

Figure 1D:
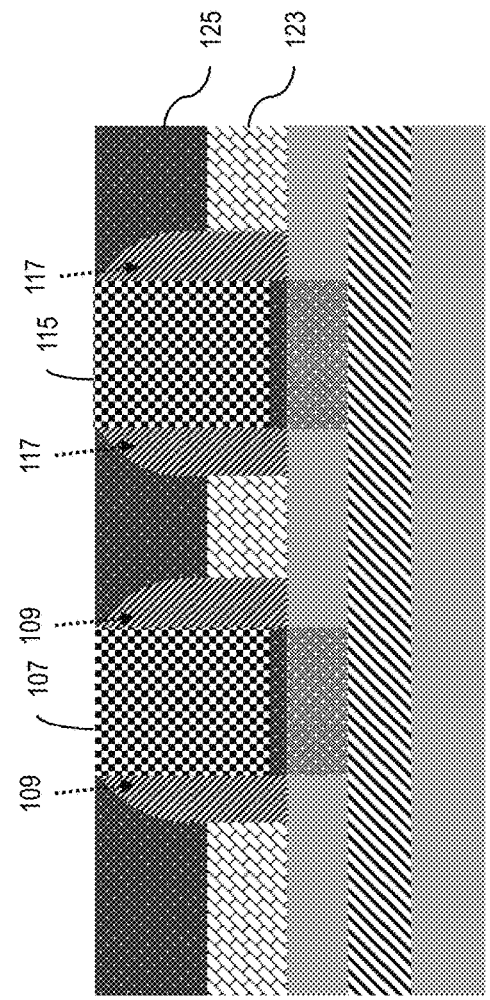

Adverting to FIG. 1D, an oxide layer 125 is formed over the S/D regions 123 and the spacers 109 and 117. The oxide layer 125 may be polished (e.g. by CMP) down to an upper surface of the dummy gates 107 and 109.

Figure 1E:
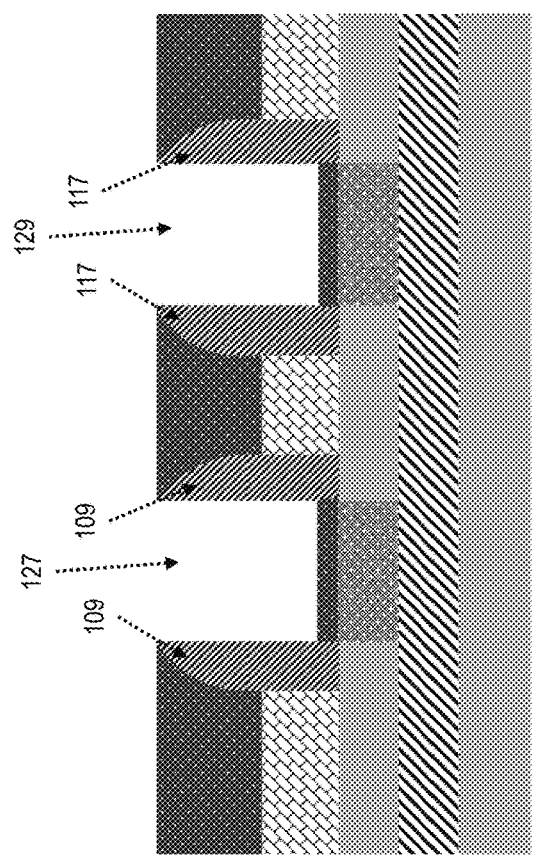

As illustrated in FIG. 1E, the polysilicon dummy gate electrodes 107 and 115 are removed creating cavities 127 and 129 between respective spacers 109 and 117.

Figure 1F:
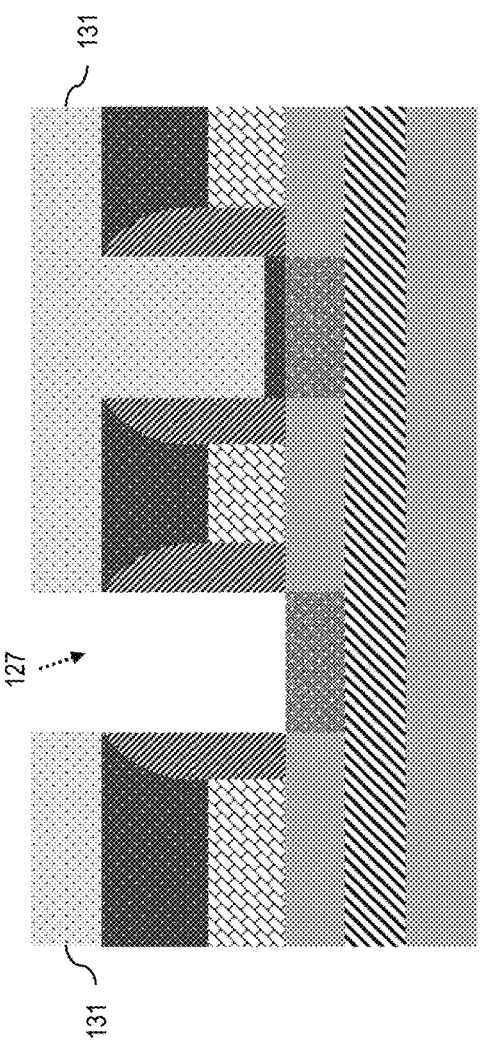

In FIG. 1F, a mask 131 (e.g. photoresist) having an opening over the cavity 127 may be utilized to remove the gate oxide layer 111 through the mask 131 and the cavity 127.

In FIG. 1G, a portion of the Si layer 101 under the cavity 127 is removed forming a recess 133 in the Si layer 101, wherein a thinner Si layer 101 would be the channel area 113 under a gate stack of the first device. In one example, the Si layer 101 may have an initial thickness of 8 to 12 nm (e.g. in both channels 113 and 121), but after a removal of a portion of the Si layer in the channel area 113, the Si layer in that channel area may have a thickness of 3 to 8 nm. The portion of the Si layer 101 may be removed by oxidizing the target portion first and then removing the oxidized Si material. Alternatively, an etching process may be utilized to remove the target portion of the Si layer 101. The thinning of the Si layer 101, for a thinner channel area 113, under the cavity 127 may be based on performance criteria (e.g., drain voltage, switching times between different states, etc.) of the first device.

In FIG. 1H, the mask 131 is removed and upper surfaces of the oxide layer 125 are cleaned. Another gate oxide layer 135 is formed on side walls and a bottom surface of the recess 133, wherein the gate oxide layer 135 has a thickness less than a thickness of the gate oxide layers 111 (e.g. of FIG. 1B) and 119.

Figure 1I:
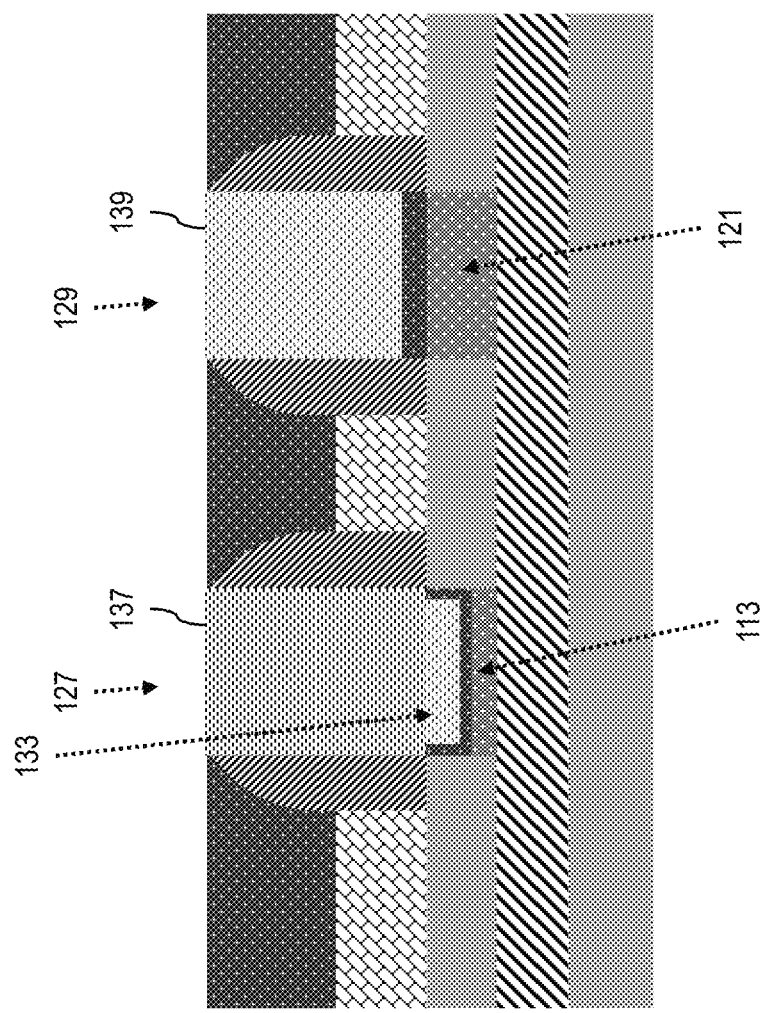

Adverting to FIG. 1I, the recess 133 and the cavities 127 and 129 are filled with a work-function (WF) metal to form RMG electrodes 137 and 139, forming the first, SG, and second, EG, devices. The SG device may operate at a lower threshold-voltage than a threshold-voltage of the EG device. A same WF metal may be used in both SG and EG devices. Alternatively, based on a thickness of each channel area 113 and 121, the WF metal used in each device may be selected so to achieve a target threshold-voltage (Vt) in each SG and EG device. For example, in a case of a large difference between the thicknesses of the two channel areas 113 and 121 (e.g. SG at 3 nm and EG at 12 nm), different WF metals may be used in the two devices in order to offset the effects of the thickness difference on the Vt of each device.

The embodiments of the present disclosure can achieve several technical effects including selectively thinning a section of a channel area under a gate of a device in an IC device. A SG device with a thinner channel layer under its gate can have a better performance while the channel layer adjacent to the SG gate will be thicker (e.g. initial thickness), and the process for epitaxially growing raised S/D regions adjacent to the SG gate can be more reliable. Moreover, EG devices in the same IC device can have a thicker channel layer for an improved HCI reliability. No additional mask layers will be required as an already available EG mask can be used. The different thicknesses of the channel layers in the SG and EG devices can provide for different threshold-voltages. Other advantages of a thinner channel layer include an improvement in drain induced barrier lowering (DIBL) effect, enablement of higher threshold-voltage targeting of PFETs (lower $I_{off}$), and an improvement in $I_{on}/I_{off}$ DC performance. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    providing a semiconductor stack including a silicon (Si) layer over an insulator layer over a Si substrate, respectively;
    providing a first dummy gate electrode over a first gate oxide layer between first spacers over a first channel area of the Si layer and a second dummy gate electrode over a second gate oxide layer between second spacers over a second channel area of the Si layer;
    forming a source/drain (S/D) region adjacent an exposed side of each first and second spacer;
    forming an oxide over the S/D regions and the first and second spacers;
    removing the first and second dummy gate electrodes creating first and second cavities between respective first and second spacers;
    forming a mask with an opening over the first cavity;
    removing the first gate oxide layer through the mask and the first cavity;
    thinning the Si layer under the first cavity, forming a recess in the Si layer;
    forming a third gate oxide layer on side walls and a bottom surface of the recess;
    filling the recess and the first and second cavities with a metal, forming first and second replacement metal gate (RMG) electrodes; and
    forming a core (SG) device and an input/output (EG) device comprising the first and second RMG electrodes, respectively.

2. The method according to claim 1, comprising thinning the Si layer by:
    oxidizing a portion of the Si layer through the first cavity; and
    removing the oxidized layer.

3. The method according to claim 1, comprising:
    thinning the Si layer under the first cavity by etching.

4. The method according to claim 1, comprising:
    forming first and second devices comprising the first and second RMG electrodes, respectively; and
    thinning the Si layer under the first cavity based on performance criteria of the first device.

5. The method according to claim 1, wherein forming the first and second RMG electrodes comprises:
    filling the recess and the first cavity with a first work-function metal; and
    filling the second cavity with a second work-function metal.

6. The method according to claim 1, comprising:
    thinning the Si layer under the first cavity to a thickness of 3 to 8 nm.

7. The method according to claim 1, wherein:
    the SG device has a lower threshold-voltage than a threshold-voltage of the EG device.

8. The method according to claim 1, comprising:
    forming the S/D regions by epitaxially growing raised S/D regions.

9. The method according to claim 1, comprising:
    forming the third gate oxide layer to a thickness less than a thickness of the first and second gate oxide layers.

10. A method comprising:
    providing a semiconductor stack including a silicon (Si) layer over an insulator layer over a Si substrate, respectively;
    providing a first polysilicon dummy gate electrode over a first gate oxide layer between first spacers over a first channel area of the Si layer and a second polysilicon dummy gate electrode over a second gate oxide layer between second spacers over a second channel area of the Si layer;
    forming a source/drain (S/D) region adjacent an exposed side of each first and second spacer;
    forming an oxide over the S/D regions and the first and second spacers;
    removing the first and second polysilicon dummy gate electrodes creating first and second cavities between respective first and second spacers;
    forming a mask with an opening over the first cavity;
    removing the first gate oxide layer through the mask and the first cavity;
    thinning the Si layer under the first cavity, forming a recess in the Si layer;
    forming a third gate oxide layer on side walls and a bottom surface of the recess, wherein a thickness of the third gate oxide layer is less than a thickness of the first and second gate oxide layers; and
    filling the recess and the first cavity with a first work-function metal and the second cavity with a second work-function metal, forming first and second replacement metal gate (RMG) electrodes associated with a core (SG) device and an input/output (EG) device, respectively, wherein the SG device has a lower threshold-voltage than a threshold-voltage of the EG device.

11. The method according to claim 10, comprising:
    thinning the Si layer under the first cavity to a thickness of 3 to 8 nm.

* * * * *